(12) United States Patent
Feldman et al.

(10) Patent No.: US 8,049,806 B2
(45) Date of Patent: Nov. 1, 2011

(54) THIN CAMERA AND ASSOCIATED METHODS

(75) Inventors: Michael R. Feldman, Huntersville, NC (US); James E. Morris, Charlotte, NC (US); Robert D. Tekolste, Charlotte, NC (US)

(73) Assignee: Digitaloptics Corporation East, Charlotte, NC (US)

( * ) Notice: Subject to any disclaimer, the term of this patent is extended or adjusted under 35 U.S.C. 154(b) by 960 days.

(21) Appl. No.: 11/487,580

(22) Filed: Jul. 17, 2006

(65) Prior Publication Data
US 2007/0126898 A1    Jun. 7, 2007

Related U.S. Application Data

(63) Continuation-in-part of application No. 10/949,807, filed on Sep. 27, 2004, now Pat. No. 7,773,143.

(51) Int. Cl.
*H04N 5/225* (2006.01)
*H04N 9/09* (2006.01)
*G02B 27/10* (2006.01)
*H01L 31/0232* (2006.01)
*H01L 21/00* (2006.01)

(52) U.S. Cl. ............ 348/340; 348/218.1; 348/265; 359/619; 257/432; 438/29

(58) Field of Classification Search ............ 348/218.1, 348/262–265, 272, 277, 340; 359/619; 257/432–433; 438/29
See application file for complete search history.

(56) References Cited

U.S. PATENT DOCUMENTS

| 4,479,143 A | 10/1984 | Watanabe et al. |
| 4,804,249 A | 2/1989 | Reynolds et al. |
| 5,274,456 A | 12/1993 | Izumi et al. |
| 5,355,222 A | 10/1994 | Heller et al. |
| 5,451,766 A | 9/1995 | Ven Berkel |
| 5,568,197 A | 10/1996 | Hamano |
| 5,671,073 A | 9/1997 | Psaltis et al. |
| 5,748,371 A | 5/1998 | Cathey, Jr. et al. |
| 5,757,423 A | 5/1998 | Tanaka et al. |

(Continued)

FOREIGN PATENT DOCUMENTS
EP    1067779 A2    1/2001
(Continued)

OTHER PUBLICATIONS

Machine Translation of JP2004-302095 published Oct. 28, 2004.*

(Continued)

*Primary Examiner* — Daniel M Pasiewicz
(74) *Attorney, Agent, or Firm* — Lee & Morse, P.C.

(57) ABSTRACT

A camera includes a first substrate having a convex refractive element, a second substrate having a concave refractive element, a separation between the first to second substrates, the separation including an air gap between convex refractive element and the concave refractive element, and a third substrate having a detector array thereon, the concave refractive element being closer to the detector than the convex refractive element, at least two of the first to third substrates being secured along a z-axis, wherein the z axis is perpendicular to a plane of the detector array, e.g., at a wafer level. The convex refractive element may include a plurality of convex refractive elements, the concave refractive element may include a plurality of concave refractive elements, and the detector array may include a plurality of detector arrays, each of the plurality forming a plurality of sub-cameras.

27 Claims, 8 Drawing Sheets

U.S. PATENT DOCUMENTS

| | | | |
|---|---|---|---|
| 5,760,832 | A | 6/1998 | Yamanaka et al. |
| 6,069,738 | A | 5/2000 | Cathey, Jr. et al. |
| 6,108,036 | A | 8/2000 | Harada et al. |
| 6,137,535 | A | 10/2000 | Meyers |
| 6,285,064 | B1 | 9/2001 | Foster |
| 6,346,969 | B1 | 2/2002 | Kwon |
| 6,366,319 | B1 | 4/2002 | Bills |
| 6,414,296 | B1 | 7/2002 | Edwards |
| 6,417,950 | B1 | 7/2002 | Cathey, Jr. et al. |
| 6,541,284 | B2 | 4/2003 | Lam |
| 6,611,289 | B1 | 8/2003 | Yu et al. |
| 6,632,701 | B2 | 10/2003 | Merrill |
| 6,635,941 | B2 * | 10/2003 | Suda ............................ 257/431 |
| 6,859,229 | B1 | 2/2005 | Suda |
| 6,882,364 | B1 | 4/2005 | Inuiya et al. |
| 7,003,177 | B1 | 2/2006 | Mendlovic et al. |
| 7,009,652 | B1 | 3/2006 | Tanida et al. |
| 7,034,866 | B1 | 4/2006 | Colmenarez et al. |
| 7,199,348 | B2 * | 4/2007 | Olsen et al. ................ 250/208.1 |
| 7,453,510 | B2 * | 11/2008 | Kolehmainen et al. ....... 348/340 |
| 7,499,093 | B2 * | 3/2009 | Campbell ..................... 348/340 |
| 7,511,749 | B2 * | 3/2009 | Gruhlk et al. ................. 348/272 |
| 7,564,019 | B2 * | 7/2009 | Olsen et al. ................ 250/208.1 |
| 7,566,855 | B2 * | 7/2009 | Olsen et al. ................ 250/208.1 |
| 2002/0006687 | A1 | 1/2002 | Lam |
| 2002/0089596 | A1 | 7/2002 | Suda |
| 2002/0122124 | A1 | 9/2002 | Suda |
| 2002/0163054 | A1 | 11/2002 | Suda |
| 2002/0163582 | A1 | 11/2002 | Gruber et al. |
| 2002/0176148 | A1 | 11/2002 | Onuki et al. |
| 2002/0181123 | A1 | 12/2002 | Han |
| 2002/0181126 | A1 | 12/2002 | Nishioka |
| 2004/0012698 | A1 * | 1/2004 | Suda et al. ..................... 348/315 |
| 2004/0095502 | A1 | 5/2004 | Losehand et al. |
| 2005/0073603 | A1 | 4/2005 | Feldman et al. |
| 2005/0104991 | A1 | 5/2005 | Hoshino et al. |
| 2005/0128335 | A1 | 6/2005 | Kolehmainen et al. |
| 2005/0242410 | A1 | 11/2005 | Groot et al. |
| 2005/0248680 | A1 | 11/2005 | Humpston |
| 2005/0258350 | A1 | 11/2005 | Van Arendonk |
| 2006/0044450 | A1 * | 3/2006 | Wolterink et al. ............ 348/340 |

FOREIGN PATENT DOCUMENTS

| | | | |
|---|---|---|---|
| EP | 1 215 729 | A2 | 6/2002 |
| EP | 1244151 | A2 | 9/2002 |
| JP | 06-269010 | A | 9/1994 |
| JP | 2002-135796 | A | 5/2002 |
| JP | 2002135796 | A * | 5/2002 |
| JP | 2004-302095 | A | 10/2004 |
| JP | 2004302095 | A * | 10/2004 |
| WO | WO 01/99431 | A1 | 12/2001 |
| WO | WO 02/077695 | A1 | 10/2002 |
| WO | WO 03/024090 | | 3/2003 |
| WO | WO 2005/041561 | | 5/2005 |

OTHER PUBLICATIONS

Tanida, et al., "Color Imaging with an Integrated Compound Imaging System", Optics Express, 11(18):2109-2117 (Sep. 8, 2003).

Kubala, et al. "Reducing Complexity in Computational Imaging System", Optical Society of America, © 2003.

Mait, et al. Evolutionary Paths in Imaging and Recent Trends, Optics Express, 11(18):2093-2101 (Sep. 8, 2003).

Potuluri, et al. "High Depth of Field Microscopic Imaging Using an Inteferometric Camera", Optics Express, 8(11):624-630 (May 21, 2001).

Tanida, et al. Thin Observation Module by Bound Optics (TOMBO): Concept and Experimental Verification, Applied Optics, 40(11):1806-1813 (Apr. 10, 2001).

Dowski, Jr., et al., [I] "Aberration Invariant Optical/Digital Incoherent Systems," Imaging Systems Laboratory, Dept. of Electrical Engineering, U.Colorado, Boulder, CO, Optical Review, 3(6A):429-432, (1996).

Dowski, Jr., et al., [II] "Aberration Invariant Optical/Digital Incoherent Optical Systems", Imaging Systems Laboratory, Dept. of Electrical Engineering, U.Colorado, Boulder, CO, (3 pages) (1996).

Dowski, Jr., et al., [III] "Wavefront Coding: A Modern Method of Achieving High Performance and/or Low Cost Imaging Systems" (9 pages), SPIE, (1999).

European Search Report in EP 11153126.5-1234, dated Mar. 24, 2011 (Feldman, et al.).

Korean Office action in KR 10-2006-7017082, dated May 17, 2011 (Feldman, et al.).

* cited by examiner

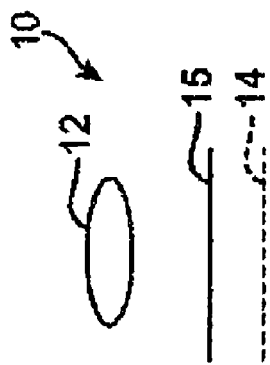

THIN CAMERA AND ASSOCIATED METHODS

CROSS-REFERENCE TO RELATED APPLICATIONS

The present invention is a continuation-in-part of commonly assigned, U.S. application Ser. No. 10/949,807, filed Sep. 27, 2004 now U.S. Pat. No. 7,773,143, and entitled "Thin Color Camera", which is hereby incorporated by reference.

BACKGROUND OF THE INVENTION

1. Field of the Invention

The present invention is directed to a thin camera. More particularly, the present invention is directed to a thin camera using color filters, a thin camera having an increased field of view and/or a thin camera that can be made on a wafer level, and associated methods.

2. Description of Related Art

A conventional camera 10, shown in FIG. 1A includes a lens 12 with a focal length f and a detector array 14, having a plurality of pixels. To realize color imaging, an array of filters 15 having some pattern, typically with more green filters than red or blue filters, is provided. An example of the filter array 15 is shown in FIG. 1B. Each filter in the filter array 15 corresponds to a detector, or pixel, in the detector array 14. However, this camera is relatively thick.

One approach to realizing a thin camera with sufficient resolution involves scaling an imaging system of a conventional camera, e.g., an f/1 camera having a lens with a focal length f. Assume the focal plane has $n_x$ pixels or sensors of a size $p_x$ in the x-direction and $n_y$ pixels of size $p_y$ in the y-direction. This camera would then have the potential to generate an image with a resolution of $n_x \times n_y$, if the imaging system had a high enough resolution. The sampling rate of the sensor plane is then equal to $1/p_x$ in the x-direction and $1/p_y$ in the y-direction. One way to measure the resolution of the imaging system is the modulation transfer function (MTF). The MTF is a measure of the contrast of spatial frequencies imaged by the optical imaging system. MTF is measured in terms of contrast as a function of spatial frequencies in lp/mm. For a sensor with pixels of dimensions of $p_x \times p_y$, an MTF of approximately 20%-50% at typical spatial frequencies of approximately $1/(4p_x)$ and $1/(4p_y)$ in each dimension may be needed in order to obtain good quality images at the resolution of the image sensor ($n_x \times n_y$).

If $p_x$ and $p_y$ could be reduced by a desired scaling factor, thus keeping $n_x$ and $n_y$ the same, as noted above, then f could be reduced, while maintaining the resolution. The problem is that as $p_x$ and $p_y$ are scaled down, higher MTF is required by the optical imaging system. It becomes harder and harder to make optical imaging systems capable of delivering the required MTF as the pixel size is scaled down. In addition, as the pixel size is reduced, other issues become more predominant including color crosstalk, electrical crosstalk, and reduced fill factor.

Another solution uses compound eye image capturing, the size of the lens being in accordance with a desired thinness of the camera. Each lens in the compound eye corresponds to a plurality of pixels, with the compound eye being selected so that spacing of the lenses is not an integral multiple of pixel spacing. Thus, each lens looks at different shifted images. The lenses used in the compound eye image capturing system generally have low resolution, for example a point spread function (PSF) much larger than the area of each pixel. A resolution greater than that of an individual sub-camera may be achieved by combining the images from multiple sub-cameras. For this solution, a color filter array 15' shown in FIG. 1C, has a color filter for each lens. Multiple lenses may be used for each color and the images for each color combined. However, the use of compound eye image capturing is computationally intensive and it is difficult to achieve a resolution equal or close to that of the number of pixels in the sensor array for the entire composite image.

One reason for the low resolution achieved with the compound eye image capturing approach, is that a large number of lenses are used, placing practical limits on the resolution for each sub-camera. In addition, the performance of each sub-camera is also typically low due to the approach taken. That is, each sub-camera in a compound eye image capturing system typically contains one lens which is located approximately one focal length away from the sensor plane. A signal separator is often used between the lens and the focal plane to reduce crosstalk. Due to the shortness of the focal length of these systems and the thickness of typical lens substrates, there is no room in such systems to place multiple compound element lens systems in the space between the entrance pupil of the lens system and the signal separator.

SUMMARY OF THE INVENTION

The present invention is therefore directed to a thin color camera and associated methods, which substantially overcome one or more of the problems due to the limitations and disadvantages of the related art.

It is therefore a feature of an embodiment of the present invention to provide a thin camera in which optical elements form a vertical stack.

It is another feature of an embodiment of the present invention to use individual sub-cameras for respective colors.

It is yet another feature of an embodiment of the present invention to provide a thin camera having both replicated lithographs and direct lithographs.

It is still another feature of an embodiment of the present invention to provide a thin camera having a concave refractive element as a final optical element before the detector array.

It is yet another feature of an embodiment of the present invention to provide a thin camera having no air gap between a substrate containing a final optical element and the detector array.

It is still another feature of an embodiment of the present invention to provide a thin camera with increasing lens diameters from an input surface to the detector array.

It is yet another feature of an embodiment of the present invention to provide a thin camera including baffles blocking stray light.

At least one of the above and other features and advantages of the present invention may be realized by providing a camera, including a first substrate having a convex refractive element, a second substrate having a concave refractive element, a separation between the first to second substrates, the separation including an air gap between convex refractive element and the concave refractive element, and a third substrate having a detector array thereon, the concave refractive element being closer to the detector than the convex refractive element, at least two of the first to third substrates being secured at a wafer level.

The camera may include a fourth substrate between the first and second substrates and a second convex refractive element on the fourth substrate. The fourth substrate may be a spacer substrate having an opening therein allowing optical communication between the convex refractive element and the concave refractive element. The fourth substrate may be opaque. The fourth substrate may include a compensation element, e.g., a diffractive element.

An air gap is provided by a structure formed on at least one of the first and second substrates. The structure may include material deposited on the at least one of the first and second substrates.

The camera may include a color filter between the first and third substrates. The color filter may be on a surface of the first substrate facing the second substrate. One of the first and second substrates may have a substantially uniformly planar surface, and the color filter may be on the substantially uniformly planar surface.

The camera may include baffle material provided on at least two surfaces of the first and second substrates. The baffle material may be provided on at least one of a surface having the convex refractive element and a surface having the concave refractive surface. The baffle material may be a lithograph. The baffle material may provide the separation. The baffle material may be a spacer substrate. The baffle material may be an adhesive.

The second substrate and the third substrate may be secured with no air gap there between. The second substrate may be directly secured to the third substrate.

The convex refractive element includes at least two refractive elements on the same surface. A discriminating element may be between the first and third substrates, the discriminating element providing different characteristics for each of the at least two refractive elements. The discriminating element may be a color filter or a patterned color filter. Baffle material may be between the at least two refractive lenses.

The concave and convex refractive elements may be lithographs. The concave and convex refractive elements may be formed on a wafer level. The concave and convex refractive elements may be formed in different materials. One of the concave and convex refractive elements may be formed by replication and another may be formed by direct lithography.

A largest separation between the substrates may be between the second substrate and a substrate adjacent a surface of the second substrate opposite the third substrate. The camera may include an array of sub-cameras, each sub-camera having at least a different convex refractive element.

At least one of the above and other features and advantages of the present invention may be realized by providing a method of making a camera, the method including forming a convex refractive element on a first planar substrate, forming a concave refractive element on a second planar substrate, providing a separator between the first and second planar substrates, the separator providing an air gap between convex refractive element and the concave refractive element, providing a third planar substrate having a detector array thereon, the third planar substrate being closer to the second planar substrate than the first planar substrate, and securing the first to third substrates, along a z-axis, wherein the z axis is perpendicular to a plane of the detector array.

Securing may include securing at least two of the first planar substrate, the second planar substrate, the separator and the third planar substrate on a wafer level. At least two of the forming of the convex refractive element, the concave refractive element and the separator may include lithography. Securing may include attaching the second substrate directly to the third substrate. Securing may hermetically seal the concave lens and/or the detector array.

At least one of the above and other features and advantages of the present invention may be realized by providing a camera, including a first substrate having a convex refractive element, a second substrate having a concave refractive element, wherein a diameter of the concave refractive element is larger than a diameter of the convex refractive element, a first separation between the first to second substrates, the separation including a first air gap between convex refractive element and the concave refractive element, and a third substrate having a detector array, the third substrate being closer to the second substrate than the first substrate, the first, second and third substrates being secured along a z-axis, wherein the z axis is perpendicular to a plane of the detector array, and a second separation between the second and third substrates, wherein the second separation is smaller than the first separation.

The camera may include baffle material on the first substrate. The camera may include baffle material on the second substrate, wherein a diameter of an opening in the baffle material on the second substrate is smaller than a diameter of an opening in the baffle material on the first substrate. The camera may include a spacer substrate serving as at least one of the first separation and the second separation. The spacer substrate may be opaque or absorptive. Baffle material may serve as one of the first and second separations. The second separation has no air gap therein.

At least one of the above and other features and advantages of the present invention may be realized by providing a camera, including a first substrate having a convex refractive element having a first lens diameter, a first baffle having a first baffle opening larger than the first lens diameter, a second substrate having a concave refractive element having a second lens diameter, a second baffle between the first and second substrates, the second baffle having a second baffle opening that is larger than the first baffle opening and the second lens diameter; and a third substrate having a detector array, the third substrate being closer to the second substrate than to the first substrate, at least two of the first, second and third substrates being secured along a z-axis, wherein the z axis is perpendicular to a plane of the detector array.

The second lens diameter may be larger than the first lens diameter. The concave refractive element may be on a top surface of the first substrate. The first baffle may be on the top surface of the first substrate. The second baffle may be a spacer substrate between the first and second substrates. At least one of the first and second baffles may be lithographs.

The convex refractive element may include a plurality of convex refractive elements, the concave refractive element may includes a plurality of concave refractive elements, and the detector array may include a plurality of detector arrays, each of the plurality forming a plurality of sub-cameras. The camera may further include an array of discriminating elements associated with each of the plurality of cameras.

At least one of the above and other features and advantages of the present invention may be realized by providing a color camera, including at least three sub-cameras, each sub-camera including a first substrate having a first imaging element, a second substrate having a second imaging element, a color filter, and a third substrate having a detector array thereon, at least two of the first to third substrates being secured at a wafer level, and a combiner for combining images from the at least three sub-cameras to form a composite multi-color image.

At least one of the above and other features and advantages of the present invention may be realized by providing a camera, including a first substrate having a first imaging element, a second substrate having a second imaging element, and a third substrate having a detector array thereon, at least two of the first to third substrates being secured at a wafer level, wherein one of the first and second imaging elements is a replicated lithograph and the other of the first and second imaging elements is a direct lithograph.

BRIEF DESCRIPTION OF THE DRAWINGS

The above and other features and advantages of the present invention will become readily apparent to those of skill in the art by describing in detail embodiments thereof with reference to the attached drawings, in which:

FIG. 1A illustrates a schematic side view of an imaging system in a conventional camera;

FIG. 1B illustrates a plan view of a conventional color filter array for use with the conventional camera of FIG. 1A;

FIG. 1C illustrates a plan view of another conventional color filter array;

DETAILED DESCRIPTION OF THE INVENTION

Figure 2A:
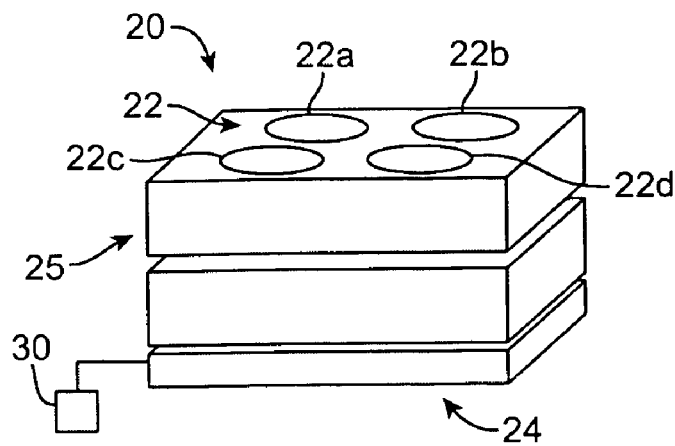
FIG. 2A illustrates a schematic perspective view of a thin camera according to an embodiment of the present invention.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the concept of the invention to those skilled in the art.

In the drawings, the thickness of layers and regions may be exaggerated for clarity. It will also be understood that when a layer is referred to as being "on" another layer or substrate, it may be directly on the other layer or substrate, or intervening layers may also be present. Further, it will be understood that when a layer is referred to as being "under" another layer, it may be directly under, or one or more intervening layers may also be present. In addition, it will also be understood that when a layer is referred to as being "between" two layers, it may be the only layer between the two layers, or one or more intervening layers may also be present. Like numbers refer to like elements throughout. As used herein, the term "wafer is to mean any substrate on which a plurality of components are formed which are to be separated prior to final use.

First, particular embodiments of a thin camera in accordance with the present invention will be described. Then, techniques that may be employed to practically manufacture these embodiments will be described.

A useful parameter in imaging systems is the f/# of the system, where f/#=f/D, where f is the focal length and D is the size of the aperture of the lens. In creating a thinner camera, while keeping the same f/# as for a conventional camera, when f is reduced, a commensurate reduction in D is needed.

The general structure of a thin camera in accordance with an embodiment of the present invention is shown in FIG. 2A. A thin camera 20 includes an imaging lens array (ILA) 22, a color filter 25 and a detector array 24. The detector array 24 may be the same as in the conventional camera, and may include a microlens array, with a microlens corresponding to each pixel to improve the fill factor. As shown in the particular example of FIG. 2A, when the focal length of the conventional single lens is halved, D is also halved and the f/# is maintained. In order to maintain the same field of view as in a conventional camera, a 2×2 array of lenses 22a-22d can be used with each lens addressing a quarter of the area of the sensor plane. Each combination of a lens 22a-22d, a color filter 25a-25d and corresponding portion of the detector array 24 constitutes a sub-camera. Thus, for the embodiment shown in FIG. 2A, there are a total of four sub-cameras. The images from each of the four sub-cameras are provided to a processor 30 where they are combined in a known manner to form a composite color image. The color filter 25 may be placed anywhere between the front of the camera and the sensor plane. For the two by two ILA, the size of the lens and the corresponding thickness of the sub-camera is half that of a conventional single lens camera, while being much more computationally straightforward than for a compound eye camera.

In FIG. 2A only the top surface lens element is shown for each lens in the ILA 22. However, the ILA may contain multiple surfaces. A single lens on one surface of a multi-surface ILA will be referred to as "a lens element." All of the optical surfaces of the ILA for a single camera will be referred to as "a lens system." Each lens system for an ILA will contain a pupil and one or more aperture stops. A region through which light is transmitted through each lens element is defined as "a lens aperture" for the lens system. Thus, the number of lens systems in a thin camera is equal to the number of sub cameras, which is equal to the number of lens apertures.

When components are manufactured from wafers that initially have substantially planar surfaces, curved surfaces can be placed on the wafer while still maintaining regions that are substantially planar. For example lens elements are typically formed in the regions of the lens apertures, but not outside of these regions. Having regions that are substantially planar facilitates stacking the components.

When wafer to wafer bonding is used to stack lens elements, precise spacing between the components may be needed. It may also be important that there is no tilt or a precisely controlled tilt between the components as they are stacked. Also, if the cameras are to be assembled at the wafer level and all cameras are to be assembled without active alignment of the z-axis spacings, then the z-axis spacings need to be controlled across the entire wafer. In order to have this control, wafer level fabrication is important because there is a macroscopic planarity across the wafer. This macroscopic planarity enables planarization techniques to be used including deposition of material along the periphery of lens elements, or along the periphery of lens element arrays or the use of spacer wafers, as discussed in detail below, as well as using a final planar surface in this stack to secure the entire optical assembly to the detector array 24. Additional optical elements may be used to compensate for deviation from a desired focal length and/or chromatic aberrations, as disclosed, for example, in U.S. Pat. No. 6,934,460, which is hereby incorporated by reference.

Thus, in contrast to a conventional camera assembly, no active focal adjustment is needed. In a conventional camera assembly, when multiple optical elements are used, these optical elements are typically placed in a cylindrical plastic housing. This housing may also provide spacing between the lens assembly and the sensor. Active focal adjustment is typically performed by adjusting this spacing after assembly using mechanical movement, e.g., through a turn-screw, during factory installation. The sensor itself may contain a sensor microlens array directly on top of the active area of the sensor, with one microlens over each pixel in the sensor. A color filter array may be located between the sensor microlens array and the sensor or directly on top of the sensor microlens array. A cover plate, e.g., a flat rectangular piece of planar glass, may be placed on top of the sensor, i.e., above the microlenses and the color filters, in order to provide a seal for the sensor while still allowing light to be transmitted. Thus, there is a separation including an air gap, between the lens assembly and the sensor. Typically, this separation may be larger than any separation between optical elements within the lens assembly. This separation may be problematic when attempting to shrink the camera.

Lens arrays other than the four lens array shown in FIG. 2A may be used in accordance with embodiments of the present invention. For example, the ILA may only have three lens apertures, one for each color. Additionally, more than three colors may be filtered by the color filter 25, while employing a corresponding lens for each color. Alternatively, no individual color filter may be associated with a lens, e.g., a fourth lens in a four sub-camera configuration, which may instead provide a Bayer pattern and a lens having a different focal length than the remaining lens systems in the ILA, e.g., a telephoto lens, a wide angle lens, a macro lens, a fisheye lens, etc., in order for different optical effects to be realized. Further alternatively, each lens systems may provide a different focal length and be associated with a Bayer pattern to realize full color.

Figure 2B:
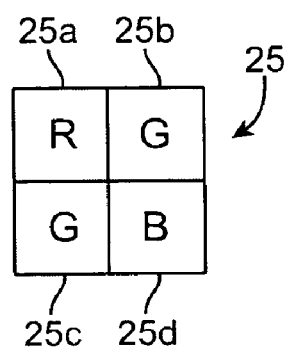
FIG. 2B illustrates a plan view of a color filter according to an embodiment of the present invention.

An exemplary embodiment of the color filter 25 to be used is shown in FIG. 2B, in which the color filter 25 may have a different color filter 25a through 25d corresponding to each lens 22a through 22d, as shown in FIG. 2B. In particular, filter 25a may transmit red (R) light, filters 25b and 25c may transmit green (G) light, and filter 25d may transmit blue (B) light. Since each lens captures the whole image, these color images may then be combined for full color image.

Figure 3A:
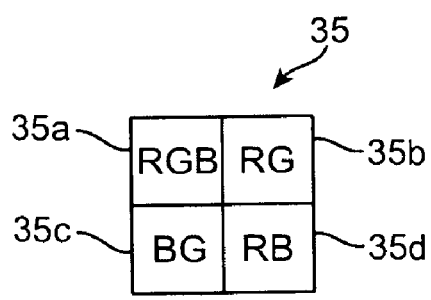
FIGS. 3A and 3B illustrate plan views of further color filters according to other embodiments of the present invention.
Figure 3B:
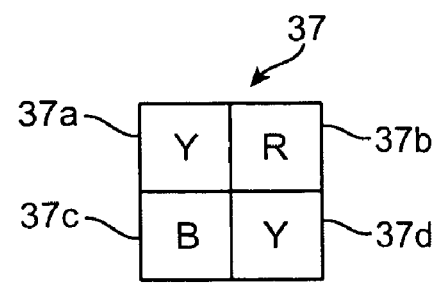

Other filter alternatives for realizing color images are shown in FIGS. 3A and 3B. Assuming four lens systems are used, a filter 35 would include regions 35a through 35d. In the embodiment shown in FIG. 3A, at least two colors may be provided on each sub-camera. Region 35a transmits all light, i.e., has no filter, region 35b transmits red and green, region 35c transmits blue and green, and region 35d transmits red and blue. Region 35d may be eliminated, due to the green dominance realized by the other regions. If all four regions are used, then to determine the value of red simply subtract the power from a sub-camera corresponding to region 35c, from a sub-camera corresponding to region 35a. Similarly, the values for the other colors can also be obtained. Thus, only three sub-cameras and associated filters are needed to realize full color, while maintaining green dominance. This may also increase the amount of light incident on the detector plane. For example, using a conventional filter, 25% of red light, 25% of blue light and 50% of green light is transmitted. With the three filters noted above, approximately 67% of red light, 67% of blue light and 100% of green light is transmitted. If the same amount of power is to be incident on each detector, then some of the light in the most transmissive filter may be blocked to provide the shifting as noted above, while allowing the detectors to have the same gain.

Another alternate embodiment uses a color filter 37 shown in FIG. 3B, which uses the format established by the Joint Photographic Experts Group (JPEG). Again assuming four lens systems are used, the filter 37 may include regions 37a through 37d. As shown in FIG. 3B, two of the regions 35a, 35d have a Y filter, region 35b has a R filter and region 35c has a B filter. In accordance with the JPEG standard, the YUV filters transmit in accordance with the following equation (1):

$$Y=0.299R+0.58G+0.114B$$
$$U=B-Y$$
$$V=R-Y \tag{1}$$

Thus, the YUV components may be determined from the filter 37 shown in FIG. 3B. The signal transmitted by the Y filter serves as the luminance. If more of the light needs to be transmitted, the proportions of the light transmitted by the Y filter could remain the same, while passing about all of the green light, about 0.51 of the red light, and about 0.2 of the blue light, with the remaining filters staying the same.

Typically, JPEG encoding has a higher number of Y samples. This fact may be used to improve the resolution of the camera. For example, by providing different information on the different Y regions, resolution can be improved. Such different information may be provided by blocking some of the light, shifting the image, or a combination thereof. If the point spread function (PSF) of the ILA is smaller than the pixel size, by focusing the light for one of the Y regions onto metal or other opaque material in the plane of the detector array to block some of the light will result in a differences between the images of the two Y regions. This may also be achieved by eliminating the microlens associated with each pixel to receive the altered image. To realize a shifted image, appropriate lenses in the ILA or microlenses for the detectors may be offset, i.e. to be off-axis. Thus, the resolution of the composite image will be determined by that of the Y image, with the other color images having a lower resolution. Again, since the Y filter allows more power through than the other filters, light can be blocked for this filter while equalizing power on the array of detectors.

The same approach may be used with the green filters for the red, blue, green configuration. Further, the shifting and/or blocking may be used in both Y regions. Finally, relative shifting of the blue and red images to each other may be used to improve the resolution of these images. Any other standard color formats, e.g., CMYK, may also be used.

Further details regarding using coded apertures to improve resolution are disclosed in commonly assigned, co-pending U.S. application Ser. No. 10/763,396, filed Jan. 26, 2004, and entitled "Thin Camera Having Sub-Pixel Resolution," and commonly assigned, co-pending U.S. application Ser. No. 10/949,807, filed Sep. 27, 2004, and entitled "Thin Color Camera," both of which are incorporated by reference. Although providing separate sub-cameras for each color may alone provide sufficient performance, the techniques disclosed in the above patents may be used in conjunction with the individual sub-cameras.

Figure 4A:
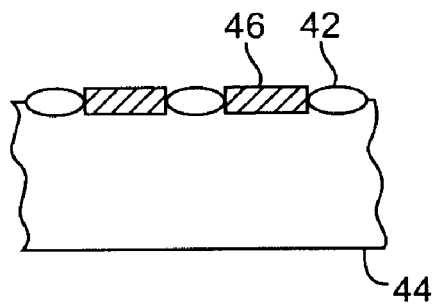
FIGS. 4A-4D illustrate schematic side views of different blocking elements in the system according to the present invention.
Figure 4B:
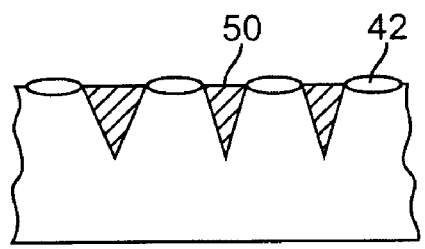

Increasing the number of lens systems in the ILA means that crosstalk may become more of an issue. A baffle blocking light between the lenses themselves or between the lenses and the detector plane isolating light from the respective lenses may be used to minimize this crosstalk or other stray light, as shown in FIGS. 4A-4D. Such a baffle may be opaque or absorptive. These baffles may be in addition conventional stops and/or may serve as conventional aperture stops within the system. While keeping the same detector size, the lens size and the focal length may be reduced to maintain the f/#, and the space between the lenses may include a blocking element as shown in FIGS. 4A, 4B and 4D. The use of smaller lenses with a low fill factor (e.g. sum of the area of the clear apertures of all the lenses less than 70% of the area of the sensor), in addition to reducing the focal length and maintaining the f/# of the system can be used to decrease cross talk and increase the field of view. While the fill factor of the lens array is then less than 100%, the detectors may still have a 100% fill factor.

As shown in FIG. 4A, baffles 46 may be placed between lenses 42 of the ILA over a detector array 44. This allows smaller lenses to be used with the same detector array 44. Providing baffles 46 on the ILA, e.g., on the top surface of the optical system, may serve to stop down the aperture of the system.

As shown in FIG. 4B, tapered baffles 50 may be between adjacent lenses 42 and between the lenses 42 and the detector plane 44. These tapered blocking elements 50 may extend to the detector plane 44 to block as much crosstalk as possible, without unnecessarily blocking wanted light.

Figure 4C:
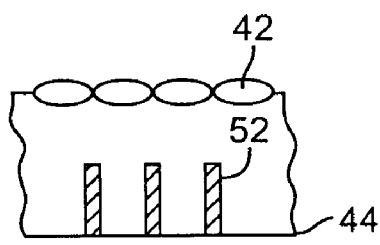
Figure 4D:
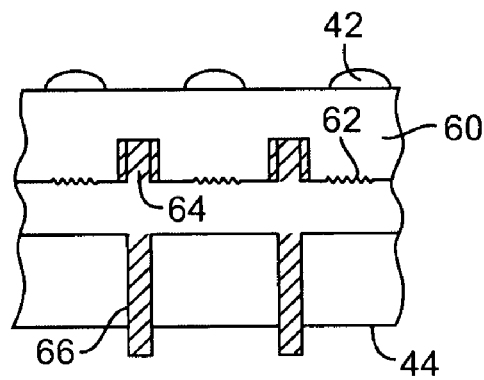

As shown in FIG. 4C, even when the lenses 42 are not spaced apart, baffles 52, here having a high aspect ratio and being close to the detector plane 44, may be used to reduce crosstalk. This may be particularly useful for blocking off-axis illumination.

As shown in FIG. 4D, the lenses 42 may be only one element in an optical system for imaging onto the detector plane 44. For example, the lenses 42 may be formed on a substrate 60, with other optical elements 64, e.g., diffractive or refractive optical elements, on an opposite surface of the substrate 60. Additionally or alternatively, further substrates containing optical elements may be provided. Further, the baffles may include a first baffle 64 and a second baffle 66 on different substrates. Here, the first baffle 64 is closer to the lenses 42 than to the detector plane 44 and is wider than the second baffle 66, which is closer to the detector plane 44. In this fashion, a tapered structure different from than in FIG. 4B may be used to minimize crosstalk.

Figure 5:
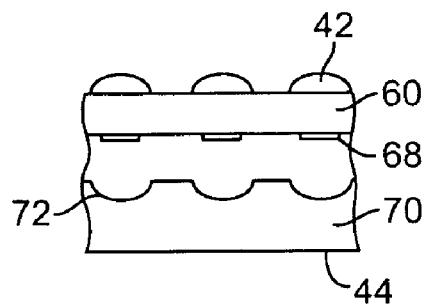
FIG. 5 illustrates a schematic side view of an embodiment of the present invention including a mask adjacent to the lenses.

In addition to or instead of having another optical element on the opposite surface of the substrate 60, a coding mask 68 may be provided on this surface, as shown in FIG. 5. This coding mask 68 may be used to increase resolution, as discussed in the above mentioned patent applications. When on the same substrate 60, alignment of the lenses 42 and the coding mask 68 may be readily realized. An additional substrate 70 including further optical elements 72 for imaging onto the detector plane 44 may be used. Here, since the coding mask 68 is not between the optical elements 72 and the detector plane 44, the optical elements 72 may be of poor quality, e.g., having aberrations, while collecting all the light. The alignment of the mask 68 relative to the lenses 42 on the same substrate 60 may be much more readily achieved than aligning the coding mask 68 on the detector plane 44, where it may also be placed, i.e., on the bottom surface of the optical system. Further, this may reduce alignment requirements between the lenses 42 and the detector plane 44.

Figure 6:
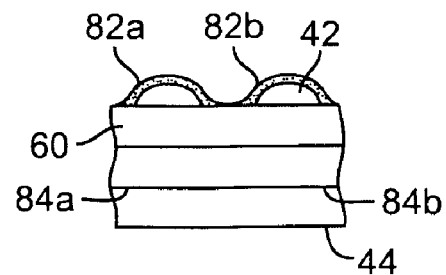
FIG. 6 illustrates a schematic side view of still another embodiment of the present invention.

Another example of an embodiment that reduces cross talk is shown in FIG. 6. Here, lenses 42 of the ILA may be covered with a color filter 82 corresponding to a color filter 84 between the ILA and the detector plane 44. In other words, the individual filters 82a, 82b of the color filter 82 may match the individual color filters 84a, 84b of the color filter 84. By filtering the colors both at the input to the sub-camera, and between the ILA and the detector plane 44, assuming adjacent filters transmit different colors, cross-talk is reduced. The color filter 82 does not have to be on top of the lenses 42, but may be beneath them, as long as it serves to block light entering one lens of the ILA from entering the path of another lens of the ILA. Further, the color filter 84 may be directly on the detector, either before or after the microlens array on the detector.

Alternatively or additionally, crosstalk may be reduced by providing opaque or absorptive material on a plurality of surfaces of these substrates to form a plurality of baffles. These baffles may allow a wider beam of light to be transmitted as the light approaches the detector. While the initial lens of the camera is smaller than a corresponding detector, unlike a conventional camera in which the initial lens is typically larger than the detector, the image in the thin camera gradually expands so that the image fills the detector.

Figure 7A:
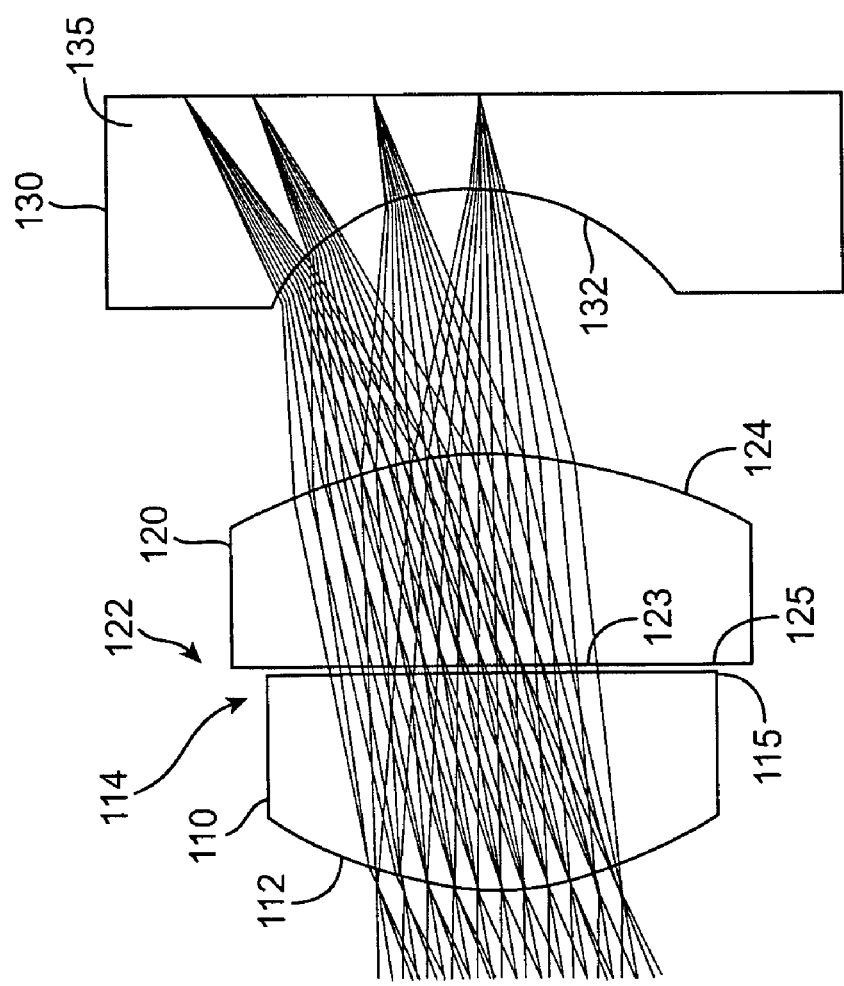
FIG. 7A illustrates a schematic side view of a thin camera according to another embodiment of the present invention.
Figure 7B:
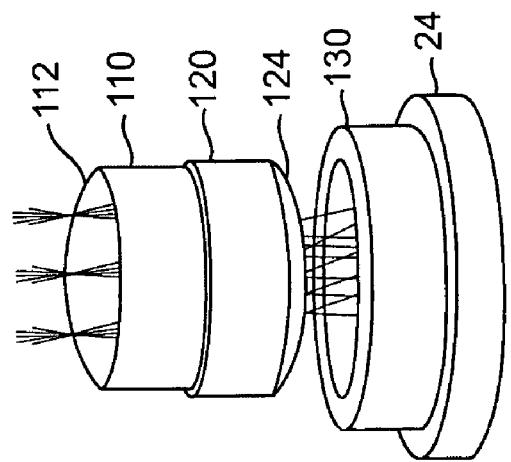
FIG. 7B illustrates a schematic perspective view of the thin camera of FIG. 7A.
Figure 7C:
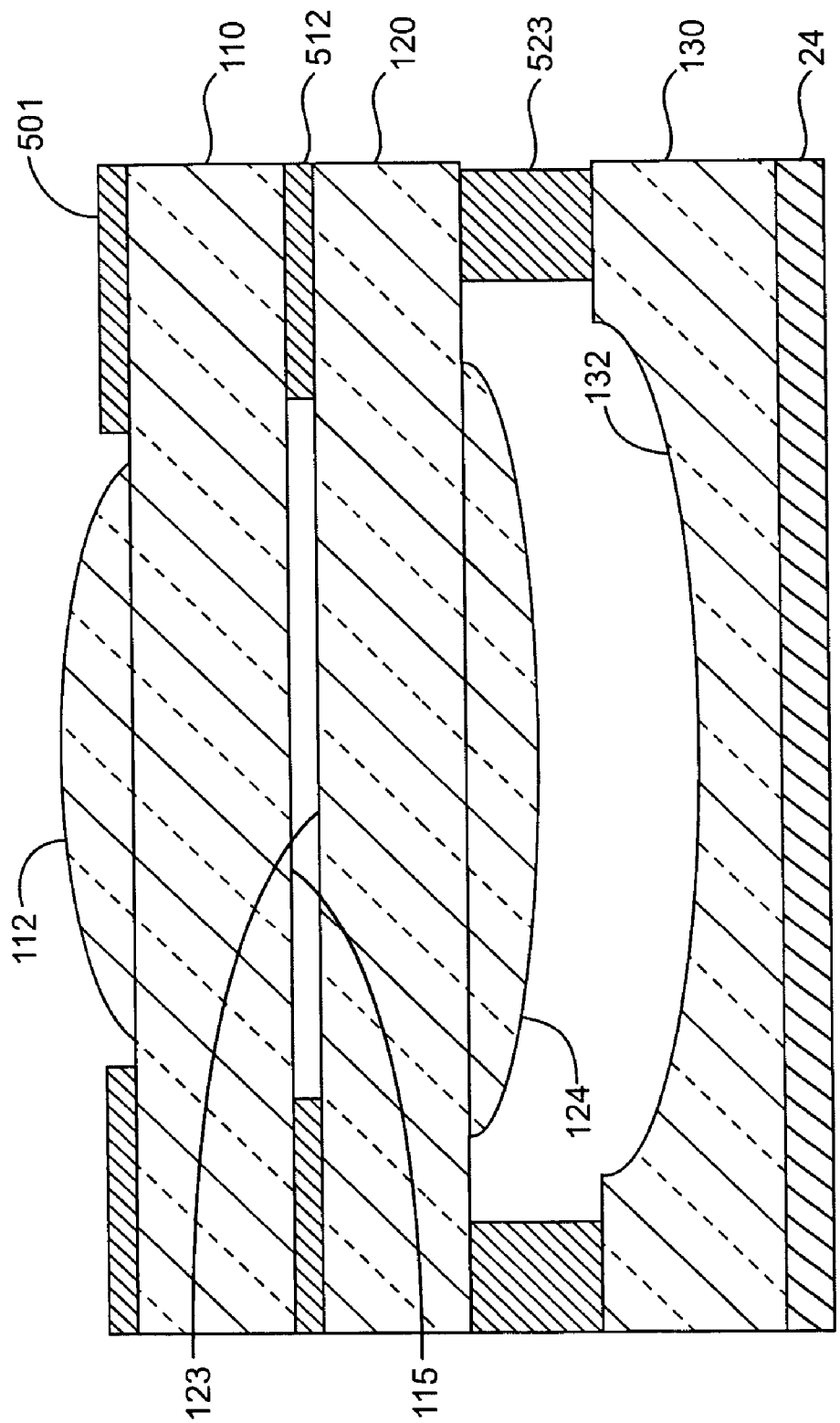
FIG. 7C illustrates a cross-sectional view of the thin camera of FIG. 7A.

A thin camera in accordance with an embodiment of the present invention is shown in FIGS. 7A to 7C. In FIGS. 7A to 7C, a single lens system may be used for all colors, and the color filter may be provided directly on the detector array 24. Of course, this lens system may be provided in any number, e.g., three or four, as discussed above, forming a plurality of sub-cameras for each camera, with a design and/or location of the color filters may be varied.

In FIGS. 7A and 7B, the different light paths correspond to different field points from the object. A first substrate 110 may have a first refractive convex surface 112 which may assist in imaging the light input thereto. A second surface 114 of the first substrate may be planar, and may include an infrared filter 115 thereon. The infrared filter 115 may be any of the surfaces. A first surface 122 of a second substrate 120 may have a diffractive element 123 thereon, which may correct for color and imaging aberrations. A second surface may have a second refractive convex surface 124, which may further assist in imaging the light. A third substrate 130 may have a refractive, concave surface 132 therein. The concave surface 132 may flatten the field of the image, so that all image points may be imaged at the same plane 135 to be imaged onto the detector array 24.

A camera using sensors as the imaging media, unlike a camera using film, may have an optical element placed right against the image plane. As shown in FIGS. 7B and 7C, the final substrate, here the third substrate 130, here including the refractive concave surface 132 may be bonded directly to the detector array 24. If the detector array includes a cover plate, the third substrate 130 may be bonded to that cover plate. If the detector array does not have a cover plate, the third substrate 130 may be secured to the microlenses associated with the detector array, and may serve as the cover plate to seal the detector array from environmental factors.

This configuration may eliminate a need for active focus adjustment. Again, additional optical elements may be used to compensate for deviation from a desired focal length and/or chromatic aberrations.

As shown in more detail in the cross-sectional view of FIG. 7C, the substrates 110, 120 and 130 may have opposing planar substrates with the optical elements 112, 115, 123, 124 and 132 formed thereon. The use of planar substrates may be advantageous, since it allows control of the tilt of all of the elements in the lens system. The use of planar substrates also allows stacking of the elements and bonding directly to the planar surfaces, which facilitates wafer level assembly. The planar surfaces of the substrates may be left in the periphery around each element or planar surfaces can be formed around the periphery of each lens element through deposition of suitable material.

Since the camera is designed to have no active focus adjustment, it is important to control the separations 512 and 523. In some cases, e.g., for separation 512, a thin spacing may be desired. In other cases, e.g., for, separation 523, a larger spacing may be needed. In both cases, separation that provide accurate control of the distance between the elements in the z-direction and that seal the optical elements to protect them, e.g., from particles, debris and other environmental factors, may be desired. It also may be advantageous to place the separation 512 and 512 outside of the optical path for at least two reasons. First, having light travel through air may aid in shortening the overall length of the camera. Second, if the separations are outside the lens apertures, opaque material may be used, allowing the separations to also serve as baffles.

Depending on an amount of separation desired, the separations 512, 523 may be realized through lithographic techniques or through the use of a separate wafer. Lithographic techniques that can be used include depositing and patterning material or, etching of the optical elements into the planar substrate such that a periphery thereof extends above the vertex of the optical element. If a material is patterned and etched, a material that is opaque or absorptive, e.g. a metal or an absorptive polymer, may be used. Polymers, e.g. SU-8, that can be patterned lithographically to controlled thicknesses, e.g., about 50-100 microns, may be used. However, since such polymers may be transmissive, in order to further serve as a baffle, the polymer may be coated with an opaque material or may be dyed to become absorptive itself. Such standoffs may be formed as disclosed, for example, in U.S. Pat. No. 5,912,872 and U.S. Pat. No. 6,096,155, or such a spacer wafer may be formed, as disclosed, for example, in U.S. Pat. No. 6,669,803, all of which are hereby incorporated by reference.

Further, an initial separation 501 of opaque and/or absorptive material, e.g., metal, may be provided on top surface of the optical system, e.g., on the same surface as the first refractive convex lens 112. The initial separation 501 may also serve as the main aperture stop. The initial separation 501 may be formed lithographically on the first substrates 110.

Some minimal air gap, sufficient to allow some air gap between opposing optical surfaces, i.e., between a vertex of a refractive surface or a diffractive surface and an opposing substrate surface, e.g., a minimum on the order of about 5-10 microns, may be needed to insure proper functioning of respective optical elements. Additionally, larger air gaps may be provided to allow for a more compact design, since light may travel at larger angles in air than in the substrates. Also, if providing lens systems having different focal lengths for different optical effects, as noted above, different air gaps may be provided for the different lens systems.

In the particular embodiment shown in FIG. 7C, the separation 523 is larger than the separation 512, allowing the image to fill the sensor 24, and both are larger than a separation between the final substrate 130 and the detector array 24, which may have no air gap therebetween. By providing a larger air gap between an initial refractive convex lens and a final refractive concave lens, while minimizing any gap between the optical system and the detector array in accordance with embodiments of the present invention, the camera may be made thinner than a conventional approach requiring spacing between the optical system and the sensors. Clearly, the separations 501, 512 and 523 may be formed in different manners and of different materials.

Note that the largest air gap in FIGS. 7A to 7C occurs prior to the concave element, 132 but after the initial convex refractive, 112. In conventional camera designs, the largest air gap typically occurs between the last optical element and the sensor. There are several reasons why this invention is different in this respect. First, having as large an air gap as possible within the camera minimizes the thickness of the camera. In general light travels at larger angles in air than within a substrate so the thickness is minimized when air gaps are larger. However, room is also needed for the substrates to hold the elements and where air is located is critical in terms of both minimizing the thickness and maximizing performance.

In addition, it is desirable to keep the clear aperture of each optical lens element smaller than the sensor, so that wafer to wafer bonding can be used. In addition, reducing the clear aperture of each lens element allows reduction in the SAG of each lens element. The smaller the SAG of each lens element, the easier and less expensive it may be to fabricate, if the elements are to be fabricated on wafers, especially if etched into a wafer. In general the smaller the diameter of each lens, the smaller the SAG. Therefore, since, it is desirable to keep the lens diameters as small as possible for each lens element, this can be achieved by keeping the beam diameter smaller than the detector element, until the very last surface. This last surface can then be used to simultaneously increase the diameter of the beam and to flatten the field. When a field flattener is used in this manner, the field flattener tends to have a diameter that is intermediate to that of the entrance pupil and that of the sensor. In addition, in this embodiment the entrance pupil may be located on the first refractive convex surface 112, so that the clear aperture of the first refractive convex surface 112 is equal to that of the entrance pupil. Thus, the clear aperture of the field flattener may be intermediate to that of the first refractive convex surface 112 and the area of the sensor 24.

For this reason, it is desirable to have a smaller diameter lens element located at or near the entrance pupil and have the clear apertures of all lens elements expand as light travels from the entrance pupil to the detector plan. It is further desirable to have the concave element have a diameter intermediate to that of the first convex lens element 112 and that of the sensor 24.

When designing a camera, in order to keep the diameters, and, therefore, the SAGs, of the convex refractive elements 112 and 124 low, it is advantageous to add a concave refractive element to both serve as a field flattener and to increase the size of the field. The concave refractive element 132 may serve these purposes. When such a field flattener is used in such a design, a large air gap may be needed prior to the concave field flattener 132.

Figure 8A:
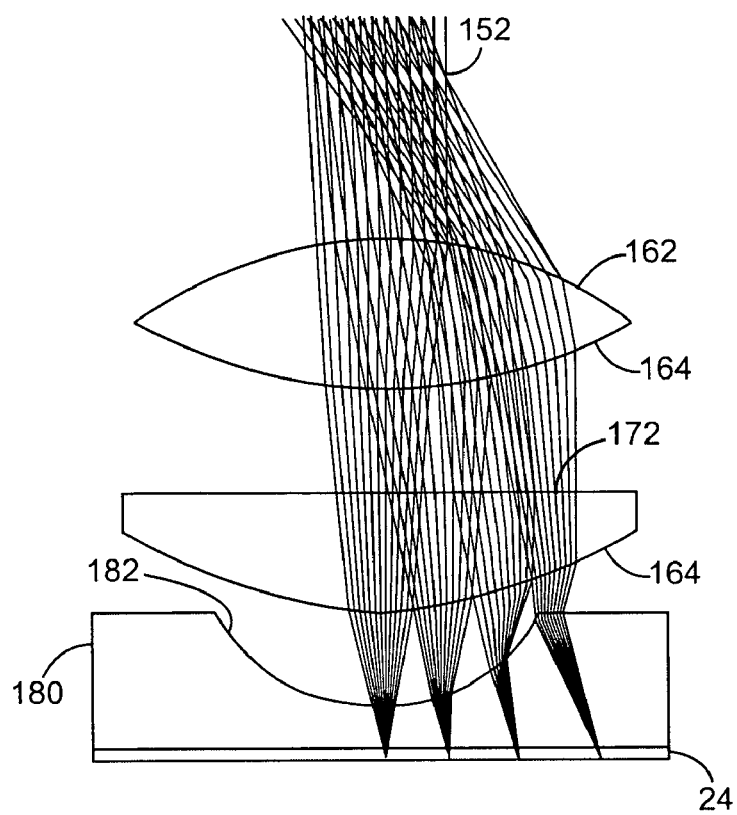
FIG. 8A illustrates a schematic side view of a thin camera in accordance with yet another embodiment of the present invention.
Figure 8B:
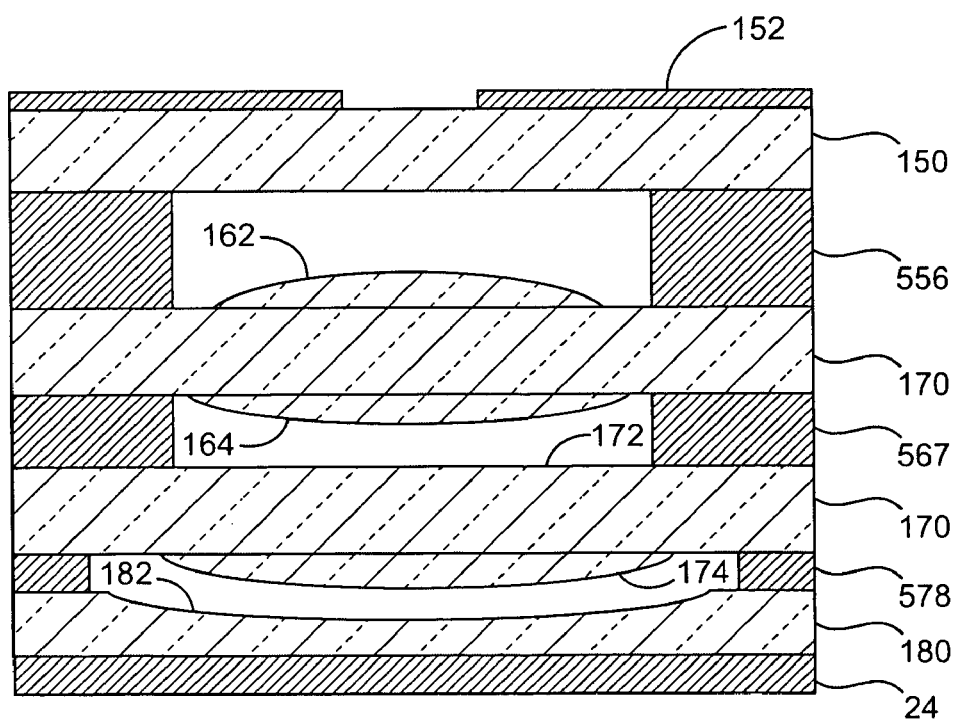
FIG. 8B illustrates a cross-sectional view of the thin camera as shown in FIG. 8A.

Another embodiment of thin camera of the present invention is shown in FIGS. 8A and 8B. Again, a single lens system may be used for all colors or this single lens system may be one of a plurality of lens systems.

In FIG. 8A, the different light paths correspond to different field points from the object. A first substrate 150 may have a main aperture stop 152 thereon, which may restrict the light input to the camera. The second substrate 160 may include a first refractive surface 162 which may assist in imaging the light input thereto. The second substrate 160 may include a second refractive surface 164 which may further assist in imaging the light.

A diffractive element 172 may be on a third substrate 170, which may correct for color and imaging aberrations. The third substrate 170 may also have a third refractive surface 174 which may further assist in imaging the light. A final substrate 180 may have a refractive, concave surface 182 therein. The concave surface 182 may flatten the field of the image, so that all image points are imaged at the same plane to be imaged onto the detector array 24.

As can be seen most clearly in FIG. 8B, separations 556, 567 and 578, between opposing substrates may be different. In the particular configuration shown in. FIGS. 8A and 8B, the largest separation 556 is between the main aperture stop 152 and the first refractive surface 162, although, in other embodiments, the largest separation could be located elsewhere, e.g., separation 567.

Figure 9:
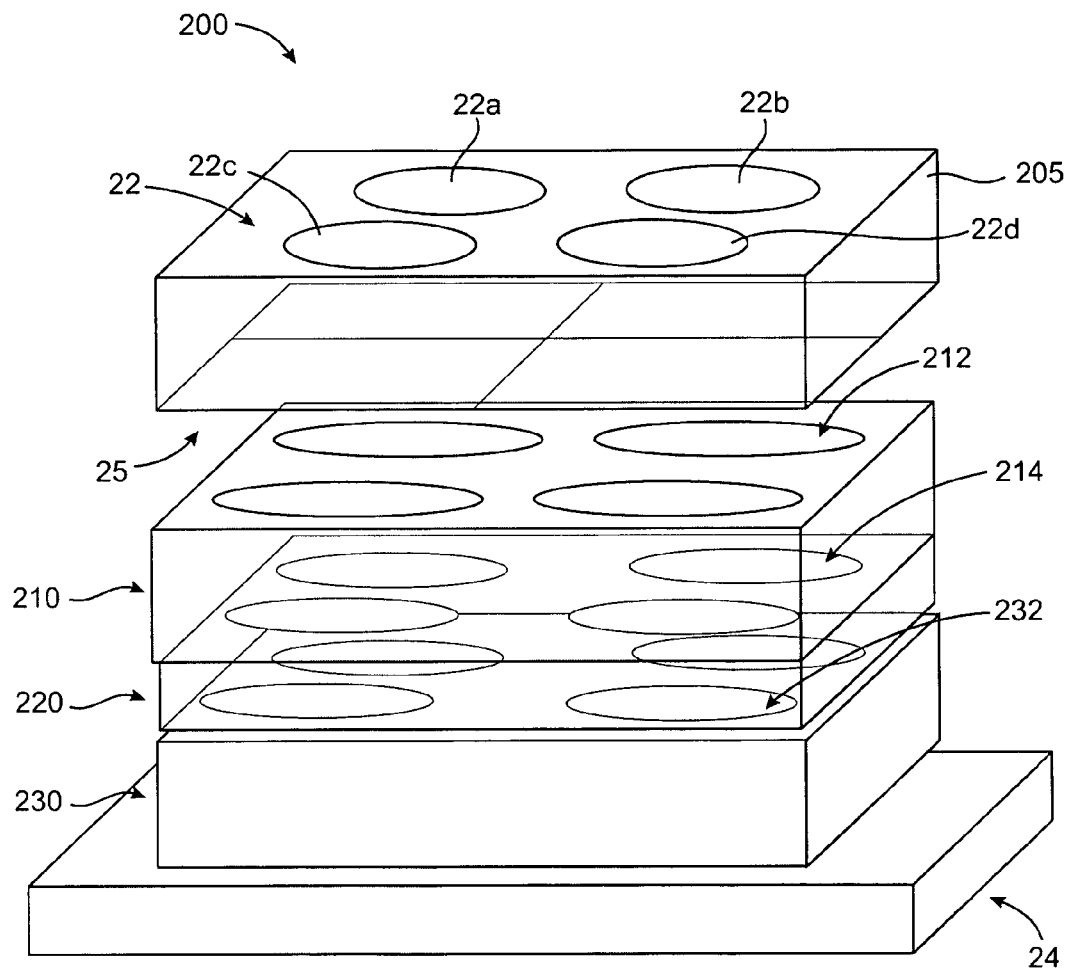
FIG. 9 illustrates an exploded schematic perspective view of a thin camera according to still another embodiment of the present invention.

As shown in FIG. 9, a thin camera 200 according to yet another embodiment of the present invention may include the multi-surface imaging lens array (ILA) 22, the color filter 25 and the detector array 24. As shown in more detail in FIG. 9, the multi-surface ILA may include a first optics substrate 205, which may have lenses 22a-22d on one surface and the color filter 25 on another surface, a second optics substrate 210, which may have lens elements thereon, e.g., diffractive optical elements 212 on one side thereof and convex refractive elements 214 on another side thereof, and a final optics substrate 230 having lens elements thereon, e.g., concave refractive elements 232.

A spacer substrate 220 may be provided between the second optics substrate 210 and final optics substrate 230. As discussed above with respect to previous embodiments, this spacer substrate 220 may serve as a baffle and may include an opening thereon to allow optical communication between the optical elements. Any desired number of substrates may be provided between the first and final substrates 205, 230, with or without spacer substrates therebetween.

Thus, in accordance with embodiments of the present invention, a thin camera may be realized by using optical elements created on a wafer level, which may be secured using planar surfaces thereof. Various mechanisms for providing separation between these optical elements may be used. Baffles, which may include the separation mechanisms, may be provided throughout the optical assembly. These separation mechanisms may also seal and protect the optical elements of the optical assembly. The final planar surface of the optical system may be placed directly on the detector array, i.e., on top of the detector microlens array or the detector cover plate. Diffractive elements and other corrective elements may be used to correct for variations from a desired optical functioning, e.g., focal length variation or aberrations. Lenses having different focal lengths may be provided in an array of cameras, to provide further optical functioning.

Some embodiments of the present invention may use an array of lenses for each camera, e.g., a lens for each color to be imaged by the optical system. Other embodiments of the present invention may use a single lens for each camera. Using a lens for each color may allow each lens to be optimized for a particular associated wavelength range, may be thinner and may allow the color filter to be placed within the optical system, i.e., after a top surface and before the detector array. However, using the plurality of lenses for each camera may increase end signal processing to combine resultant images. Using a single lens may fit a more conventional approach, reducing post processing, but cannot be made as thin and may require the color filter to remain in the detector array.

Figure 10:
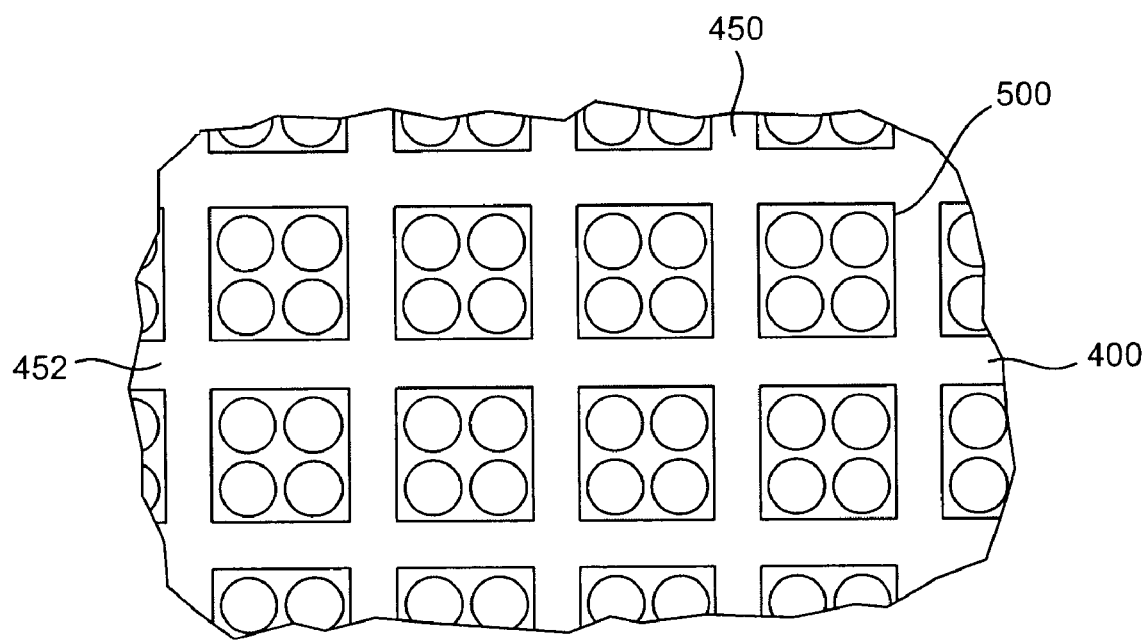
FIG. 10 illustrates a plan view of a plurality of thin cameras in accordance with any of the embodiments of the present invention to be made in parallel.

FIG. 10 illustrates a partial plan view of a plurality of thin cameras in accordance with any of the above embodiments formed in parallel. As shown in FIG. 10, all or components of a plurality of thin cameras 500, here each including a four lens ILA, may be formed on a wafer 400. One or more of the components of the thin cameras 500 may be secured together simultaneously and then singulated, e.g., along lanes 450 and 452, to form the individual thin cameras 500.

The creation of passive optical elements in wafer form and securing these passive optical elements with other passive optical elements or with electro-optical elements at a wafer or die level, and using the wafers and/or adhesive material securing the wafer to seal elements therebetween is well known, as disclosed in U.S. Pat. Nos. 5,912,872 and 6,096,155. As disclosed therein, the substrates may be secured on planar surfaces thereof, and may be secured by providing adhesive materials, e.g., epoxy or solder, or may fuse adjoining substrates. As further disclosed in these patents, kinematic features may be formed lithographically to aid in mating and aligning substrates.

As also disclosed in these patents, the creation of passive optical elements may be performed lithographically or a master may be made and passive optical elements replicated from this master, either of which will be referred to herein as "lithographs." Further, a replicated lithograph may be transferred into a substrate, as disclosed, for example, in U.S. Pat. No. 6,027,595, which is incorporated by reference herein. The method and material used to make these passive optical elements may be determined by the design of the passive optical elements. For example, if a refractive optical element having a large sag is required, replication may be advantageous, as direct lithographic techniques may require a lot of time to create such a lens, since an etch time is directly proportional to the sag.

There are a limited number of transparent materials that are suitable for direct lithography, e.g., glass, e.g., fused silica. Unfortunately, many materials suitable for direct lithography may have similar indices of refraction and dispersion. This makes it very difficult to design a high quality imaging system, i.e., one with high MTF across the entire field, using wafer-level fabricated optical components. In particular chromatic aberrations may be a particular source resulting in decreased MTF. One solution to this issue is to use a diffractive element to reduce the chromatic aberrations. In addition, the wavelength range of each lens system can be narrowed, i.e., using different colors for each lens system, the chromatic aberrations are further reduced. Another potential solution is to use polymer materials for some of the lens surfaces.

There are more materials available for replication when the replicated lithograph is the final element, e.g., various plastic materials, e.g., polymers. These plastic materials may typically be cheaper and lighter than glass, but may have a higher coefficient of thermal expansion and may have a higher dispersion than glass.

As noted above, typically, replicated elements are made of a polymer and lithographic elements are made of glass. These materials have different coefficients of thermal expansion, different indices of refraction, and different chromatic dispersion characteristics. By constructing a system using both polymer optical elements and glass optical elements, a higher MTF may be realized compared to using one material alone. Thus, a system may be created using direct lithography for some optical elements and replication for other optical elements.

At least two of the first substrate, the second substrate, the final substrate and the detector array may be created and secured on a wafer level, i.e., a plurality of these elements may be created and secured together, and then singulated to form the stack shown, for example, in FIG. 2, 7C, 8B or 9. Such wafer level creation may be realized in accordance with the teachings of U.S. Pat. Nos. 6,451,150 and 6,483,627, which are incorporated by reference herein in their entirety. Further, all of the optical elements may be created on a wafer level, even if only secured on a die level. As shown in FIGS. 2, 7C and 8B, substrates having the passive optical elements thereon may be coextensive with the detector substrate, or the substrate having the detector array may extend beyond the passive optical elements in at least one direction, as shown in FIG. 9. Alternatively, only the final substrate may be coextensive with the detector array.

Components of the cameras 500 may be secured and singulated, and then secured to other components which have also been previously secured and singulated with other components. Alternatively, instead of singulating the cameras, an array of these cameras providing different optical effects, e.g., different focal lengths, may be provided by the different cameras. For example, a two by two array of cameras 500, one having a standard lens configuration, another having a wide angle lens, another having a telephoto lens, and another having a macro lens, may be formed.

As discussed in detail above, in designing a thin camera, it is advantageous to have large air gaps at some point between the first lens and the sensor. However, when wafer based optics are used, it is also advantageous to fabricate the optical elements on substrates that have a thickness large enough to support the elements across the entire wafer. This limits the locations in which large air gaps can be placed. That is, if a large air gap is placed between two elements, in many cases, that may be the only place a large air gap can be used while still fitting all the substrates and elements needed for the camera within the thin space constraint. In other words, in designing a thin camera, only one large air gap may be available. Therefore, the location of the large air gap or the largest air gap between any two elements may be a critical design parameter.

In conventional camera design, the largest air gap is typically placed between the last lens surface and the sensor. This is often done because it is difficult to place a lens element directly on or close to the sensor plane. As noted above, with a wafer scale camera, this constraint is removed. Optical surfaces can be easily located near the sensor plane as described above. Placing a field flattener near the sensor plane may allow the bulk of the imaging optics, e.g., elements 112, 124 in FIGS. 7A-7C, elements 162, 164, 174 in FIG. 8A-8B, to have a smaller apertures, and, thus, smaller diameters and SAGs, and perform their imaging function with higher field curvature and more demagnification, which, in turn, may be corrected by the field flattener, which both expands the field and flattens it. Thus, having the largest air gap between any two components located between two optical element surfaces, as opposed to between the last lens element surface and the sensor, may result in a more easily manufacturable design for a wafer scale camera. The largest gap may be located between the last lens surface prior to the field flattener and the field flattener addition, as shown, for example, in FIGS. 7A-7C.

Embodiments of the present invention have been disclosed herein and, although specific terms are employed, they are used and are to be interpreted in a generic and descriptive sense only and not for purpose of limitation. For example, while conventional three color components have been illustrated throughout, any appropriate three or more color components for realizing full color imaging may be employed. Further, while circular lenses have been illustrated for the ILA, other shapes allowing higher packing densities for a higher fill factor, such as hexagonal lenses, may be used. Additionally, while different apertures have been described for providing different images in the sub-cameras having the same color, other optical elements that provide a difference may be used. For example, the active areas of the pixels themselves may be shaped differently for the different sub-cameras. Accordingly, it will be understood by those of ordinary skill in the art that various changes in form and details may be made without departing from the spirit and scope of the present invention as set forth in the following claims.

What is claimed is:

1. A camera, comprising:
a first substrate having first and second opposing surfaces, the first and second surfaces having first and second planar regions in a periphery thereof;
a convex refractive element on one of the first and second surfaces of the first substrate;
a second substrate having third and fourth opposing surfaces, the third and fourth surfaces having third and fourth planar regions in a periphery thereof;
a concave refractive element on one of the third and fourth surfaces of the second substrate;
a separation between the first to second substrates, the separation including an air gap between the convex refractive element and the concave refractive element;
a third substrate having fifth and sixth opposing surfaces, the fifth and sixth surfaces having fifth and sixth planar regions in a periphery thereof; and
a detector array on the third substrate, the concave refractive element being closer to the detector array than the convex refractive element, the first to third substrates being stacked along a z-axis, wherein the z axis is perpendicular to a plane of the detector array, and secured along the z-axis at respective opposing planar regions.

2. The camera as claimed in claim 1, further comprising a compensation element.

3. The camera as claimed in claim 2, wherein the compensation element is a diffractive element.

4. The camera as claimed in claim 1, wherein an air gap is provided by a structure formed on at least one of the first and second substrates.

5. The camera as claimed in claim 4, wherein the structure includes material deposited on the at least one of the first and second substrates.

6. The camera as claimed in claim 1, further comprising baffle material provided on at least two of the first to fourth surfaces of the first and second substrates.

7. The camera as claimed in claim 6, wherein the baffle material is provided on at least one of a surface having the convex refractive element and a surface having the concave refractive surface.

8. The camera as claimed in claim 6, wherein the baffle material on the at least one surface is a lithograph.

9. The camera as claimed in claim 6, wherein the baffle material provides the separation.

10. The camera as claimed in claim 9, wherein the baffle material is an adhesive.

11. The camera as claimed in claim 1, wherein the second substrate and the third substrate are secured with no air gap there between.

12. The camera as claimed in claim 1, wherein the convex refractive element includes at least two refractive elements.

13. The camera as claimed in claim 12, further comprising a discriminating element between the first and third substrates, the discriminating element providing different characteristics for each of the at least two refractive elements.

14. The camera as claimed in claim 13, wherein the discriminating element is a color filter.

15. The camera as claimed in claim 13, wherein the discriminating element is a patterned color filter.

16. The camera as claimed in claim 12, further comprising baffle material between the at least two refractive lenses.

17. The camera as claimed in claim 1, wherein the concave and convex refractive elements are formed in different materials.

18. The camera as claimed in claim 17, wherein one of the concave and convex refractive elements is in a replication material on a corresponding substrate and another is in a corresponding substrate.

19. The camera as claimed in claim 1, wherein the camera includes an array of sub-cameras, each camera having at least a different convex refractive element.

20. A method of making a camera, the method comprising:
forming a convex refractive element on a surface of a first planar substrate having first and second opposing surfaces, the first and second surfaces having first and second planar regions in a periphery thereof;
forming a concave refractive element on a surface of a second planar substrate having third and fourth opposing surfaces, the third and fourth surfaces having third and fourth planar regions in a periphery thereof;
providing a separator between the first and second planar substrates, the separator providing an air gap between convex refractive element and the concave refractive element;
providing a third planar substrate having a detector array thereon, the third planar substrate having fifth and sixth opposing surfaces, the fifth and sixth surfaces having fifth and sixth planar regions in a periphery thereof the third planar substrate being closer to the second planar substrate than the first planar substrate;
stacking the first to third substrates along a z-axis, wherein the z axis is perpendicular to a plane of the detector array; and
securing the first to third substrates at respective opposing planar regions, along the z-axis.

21. The method as claimed in claim 20, wherein securing includes securing at least two of the first planar substrate, the second planar substrate, the separator and the third planar substrate on a wafer level.

22. The method as claimed in claim 20, wherein securing hermetically seals the concave lens.

23. The method as claimed in claim 20, wherein securing hermetically seals the detector array.

24. A camera, comprising:
a first substrate having first and second opposing surfaces, the first and second surfaces having first and second planar regions in a periphery thereof;
a convex refractive element on one of the first and second opposing surfaces;
a second substrate having third and fourth opposing surfaces, the third and fourth surfaces having third and fourth planar regions in a periphery thereof;
a concave refractive element on one of the third and fourth surfaces of the second substrate, wherein a diameter of the concave refractive element is larger than a diameter of the convex refractive element;
a first separation between the first to second substrates, the separation including a first air gap between convex refractive element and the concave refractive element;
a third substrate having fifth and sixth opposing surfaces, the fifth and sixth surfaces having fifth and sixth planar regions in a periphery thereof;
a detector array on the third substrate, the third substrate being closer to the second substrate than the first substrate, the first, second and third substrates being stacked and secured along a z-axis, wherein the z axis is perpendicular to a plane of the detector array at respective opposing planar regions; and
a second separation between the second and third substrates, wherein the second separation is smaller than the first separation.

25. The camera as claimed in claim 24, wherein the convex refractive element includes a plurality of convex refractive elements, the concave refractive element includes a plurality of concave refractive elements, and the detector array includes a plurality of detector arrays, each of the plurality forming a plurality of sub-cameras, and further comprising:
an array of discriminating elements associated with each of the plurality of sub-cameras.

26. A camera, comprising:
a first substrate having a convex refractive element having a first lens diameter;
a first baffle having a first baffle opening larger than the first lens diameter;
a second substrate having a concave refractive element having a second lens diameter, the concave refractive element on a surface of the second substrate facing the first substrate;
a second baffle between the first substrate and the surface of the second substrate facing the first substrate, the second baffle having a second baffle opening that is larger than the first baffle opening and the second lens diameter; and
a third substrate having a detector array, the third substrate being closer to the second substrate than to the first substrate.

27. The camera as claimed in claim 26, wherein the second lens diameter is larger than the first lens diameter.

* * * * *